(12) United States Patent
Smith et al.

(10) Patent No.: US 7,053,979 B2
(45) Date of Patent: May 30, 2006

(54) PROCESS FOR AMELIORATION OF SCANNING SYNCHRONIZATION ERROR

(75) Inventors: Adlai H. Smith, Escondido, CA (US); Robert O. Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 177 days.

(21) Appl. No.: 10/844,757

(22) Filed: May 12, 2004

(65) Prior Publication Data

US 2005/0254027 A1 Nov. 17, 2005

(51) Int. Cl.
*G03B 27/68* (2006.01)
*G03C 5/00* (2006.01)

(52) U.S. Cl. .......................... 355/52; 430/30
(58) Field of Classification Search ............. 355/52
See application file for complete search history.

(56) References Cited

U.S. PATENT DOCUMENTS

| | | | |
|---|---|---|---|
| 4,861,148 A | 8/1989 | Sato et al. ............. | 350/505 |
| 5,285,236 A | 2/1994 | Jain ...................... | 355/53 |
| 5,300,786 A | 4/1994 | Brunner et al. ........ | 250/548 |
| 5,303,002 A | 4/1994 | Yan ....................... | 355/53 |
| 5,757,507 A | 5/1998 | Auschnitt et al. ...... | 356/401 |
| 5,828,455 A | 10/1998 | Smith et al. .......... | 356/354 |
| 5,936,738 A | 8/1999 | Liebmann et al. ..... | 356/401 |
| 5,978,085 A | 11/1999 | Smith et al. .......... | 356/354 |
| 2002/0135776 A1* | 9/2002 | Nishi ..................... | 356/500 |
| 2003/0174298 A1* | 9/2003 | Yoshimura ............. | 355/52 |

OTHER PUBLICATIONS

R. DeJule, "Mix-and-Match: A Necessary Choice", *Semiconductor International*, Feb. 2000, pp. 66-76.
R. DeJule, "A Look at Overlay Error", *Semiconductor International*, Feb. 2000, p. 52.
D. Cote et al., "Micrascan™ III Performance of a Third Generation, Catadioptric Step and Scan Lithographic Tool", *SPIE* vol.. 3051, pp. 806-816.
J. Mulkens et al., "ArF Step and Scan Exposure System for 0.15 µm and 0.13 µm Technology Node?", *SPIE* vol. 3679, Mar. 1999, pp. 506-521.
T.A. Brunner, "Impact of Lens Aberrations on Optical Lithography", pp. 1-9.

(Continued)

*Primary Examiner*—W. B. Perkey
*Assistant Examiner*—Kevin Gutierrez

(57) ABSTRACT

Scanning synchronization error in a projection imaging system is controlled by obtaining one or more scanning synchronization error maps comprising a plurality of error components, obtaining one or more focal plane deviation (FPD) error maps comprising a plurality of error components, separating the one or more synchronization error maps and one or more FPD error map error components into one or more repeatable and non-repeatable parts, converting the repeatable parts into one or more mathematical models that express the repeatable parts in mode correctable and uncorrectable terms, inputting lens distortion map data, scanning synchronization error map data, FPD error map data, and the one or more mathematical models into a database linked to a process controller that executes process control algorithms, and correcting scanner motion of the projection imaging system based on output from the process controller.

39 Claims, 13 Drawing Sheets

OTHER PUBLICATIONS

J. van Schoot et al., "0.7 NA DUV Step & Scan System for 150nm Imaging with Improved Overlay", *SPIE* vol. 3679, Mar. 1999, pp. 448-456.

H. G. Müller et al., "Large Area Fine Line Patterning by Scanning Projection Lithography", pp. 100-104.

J.E. Bjorkholm et al., "Reduction Imaging at 14nm Using Multilayer-Coated Optics: Printing of Features Smaller than 0.1μm", *J. Vac. ci. Technol.* B 8 (6), Nov./Dec. 1990, pp. 1509-1513.

B. E. Newnam et al., "Development of XUV Projection Lithography at 60-80 nm", *SPIE* vol. 1671, 1992, pp. 419-427.

W. H. Press et al., "Numerical Recipes The Art of Scientific Computing", pp. 52-64.

C. P. Ausschnitt, "Distinguishing Dose from Defocus for In-Line Lithography Conrol", *SPIE* vol. 3677, Mar. 1999, pp. 140-147.

G. M. Pugh, "Detailed Study of a Phase-Shift Focus Monitor", *SPIE* vol. 2440, pp. 690-700.

J.W. Gemmink, "A Simple and Calibratable Method for the Determinationo f Optimal Focus", *SPIE* vol. 1088, 1989, pp. 220-230.

J. P. Kirk, "Astigmatism and Field Curvature from Pin-Bars", *SPIE* vol. 1463, pp. 282-291.

M. Terry et al., "Gauging the Performance of An In-Situ Interferometer".

M. Dusa et al., "Photo-Lithographic Lens Characterization of Critical Dimension Variation Using Empirical Focal Plane Modeling", *SPIE* vol. 3051, Mar. 13, 1997, pp. 1-10.

J. H. Bruning, "Optical Lithography—thirty Years and Three Orders of Magnitude", *SPIE* vol. 3051, pp. 14-27.

"Quaestor Q7 Brochure", *Bio-Rad Semiconductor Systems*.

B. Lin, "the attenuated Phase-Shifting Mask", *Solid State Technology*, Jan. 1992, pp. 43-47.

T.A. Brunner et al., "Quantitative Stepper Metrology using the Focus Monitor Test Mask", *SPIE*, vol. 2197, pp. 541-549.

N. M. Ceglio et al., "Soft X-Ray Projection Lithography", *J. Vac. Sci. Technol. B 8 (6)*, Nov./Dec. 1990. pp. 1325-1328.

H. R. Huff et al., "Competitive Assessment of 200 mm Epitaxial Silicon Wafer Flatness", *SPIE* vol. 3332, pp. 625-630.

P. Dirksen et al., "Latent Image Metrology for Production Wafer Steppers", *SPIE* vol. 2440, pp. 701-711.

International Technology Roadmap for Semiconductors, 2001 Edition, *SEMATECH*, pp. 1-21.

G. Davies et al., "193 nm Step and Scan Lithography", pp. 1-15.

S. D. Hsu et al., "Controlling Focal Plane Tilt", pp. 1-5.

R. D. Mih et al., Using the Focus Monitor Test Mask to Characterize Lithographic Performance, *SPIE*, vol. 2440, pp. 657-665.

\* cited by examiner

PROCESS FOR AMELIORATION OF SCANNING SYNCHRONIZATION ERROR

BACKGROUND

1. Field of the Invention

The present invention relates generally to processes for semiconductor manufacturing and, more particularly, to modeling, measuring, characterizing, and controlling overlay and focusing errors associated with scanning projection systems used in ULSI photolithography.

2. Description of the Related Art

General

It is very likely that sub-50 nm lithographic processing will require extremely tight layer-to-layer overlay tolerances to meet next generation device performance requirements (see, for example, "2001 ITRS Roadmap", SEMATECH, pp. 1–21). Overlay registration on critical layers can directly impact device performance, yield, and repeatability. A typical microelectronic device or circuit can frequently include more than twenty levels or pattern layers. The placement of patterned features on each of the levels must match the placement of corresponding features on other levels—called overlap—within an accuracy that is some fraction of the minimum feature size or critical dimension (CD). Overlay error is typically, although not exclusively, measured with a metrology tool that is appropriately called an overlay tool, using several techniques (see, for example, "Semiconductor Pattern Overlay", N. Sullivan, *SPIE Critical Reviews*, Vol. CR52, pp. 160–188). The terms "overlay metrology tool" and "overlay tool" are used to mean any tool capable of determining the relative position of two alignment attributes that are separated within 2000 um (microns) of each other. The importance of overlay error and its impact to yield is known and is described elsewhere (see, for example, "Measuring Fab Overlay Programs", R. Martin et al., *SPIE Conference on Metrology, Inspection, and Process Control for Microlithography XIII*, pp. 64–71, March 1999, and "A New Approach to Correlating Overlay and Yield", M. Preil et al., *SPIE Conference on Metrology, Inspection, and Process Control for Microlithography XIII*, pp. 208–216, March 1999). Lithographers have created statistical computer algorithms (for example, Klass II, "Lens Matching and Distortion Testing in a Multi-Stepper, Sub-Micron Environment", A. Yost et al., *SPIE*, Vol. 1087, pp. 233–244, 1989; and Monolith, "A Computer Aided Engineering Workstation for Registration Control", E. McFadden et al., *SPIE*, Vol. 1087, pp. 255:266, 1989) that attempt to quantify and divide overlay error into repeatable or systematic and non-repeatable or random effects (see, for example, "Matching of Multiple Wafer Steppers for 0.35 Micron Lithography Using Advanced Optimization Schemes", M. van den Brink et al., *SPIE*, Vol. 1926, pp. 188:207, 1993; "A Computer Aided Engineering Workstation for Registration Control", supra; "Semiconductor Pattern Overlay", supra; and "Machine Models and Registration", T. Zavecz, *SPIE Critical Reviews*, Vol. CR52, pp. 134–159). An overall theoretical review of overlay modeling can be found in "Semiconductor Pattern Overlay", supra. Overlay error is typically divided into the following two major categories. The first category, called inter-field or grid overlay error, is concerned with the actual position of the translation and rotation or yaw of the image field as recorded in the photoresist on a silicon wafer using an exposure tool, i.e., stepper or scanner (see FIG. 1). The second category, called intra-field overlay error, is the positional offset of an individual point inside a field referenced to the nominal center of an individual exposure field (see FIG. 1). Intra-field overlay errors are generally composed of lens aberrations or distortions, scanning irregularities, and reticle alignment.

It should be noted that most overlay measurements are made on silicon product wafers after each photolithographic process, prior to final etch. Product wafers cannot be etched until the photoresist target patterns are properly aligned to the underlying target patterns. See "Super Sparse Overlay Sampling Plans: An Evaluation of Methods and Algorithms for Optimizing Overlay Quality Control and Metrology", J. Pellegrini, *SPIE*, Vol. 3677, pp. 72–82. Manufacturing facilities generally rely heavily on exposure tool alignment and calibration procedures to help insure that the scanner tools are aligning properly. See, for example, "Stepper Matching for Optimum Line Performance", T. Dooly et al., *SPIE*, Vol. 3051, pp. 426–432, 1997; "Mix-and-Match: A Necessary Choice", R. DeJule, *Semiconductor International*, pp. 66–76, February 2000; and "Matching Performance for Multiple Wafer Steppers Using an Advanced Metrology Procedure", M. van den Brink et al., *SPIE*, Vol. 921, pp. 180–197, 1988. Inaccurate overlay modeling algorithms can corrupt the exposure tool calibration procedures and degrade the alignment accuracy of the exposure tool system. See "Super Sparse Overlay Sampling Plans: An Evaluation of Methods and Algorithms for Optimizing Overlay Quality Control and Metrology", supra.

Finally, while overlay error measures the x and y positional alignment of patterned features in reference to other layers, focusing error (z positional error) typically reduces image fidelity and changes the effective magnification of the photolithographic imaging system. While some techniques use focusing errors (chromatic enhancements) to attempt to improve the overall lithographic depth of focus (see, for example, "Method and Apparatus for Enhancing the Focus Latitude in Lithography", Pei-Yang Yan, U.S. Pat. No. 5,303,002 issued Apr. 12, 1994), unintentional and uncorrected focus error reduces both image fidelity and the lithographic process window (see, for example, "Comprehensive Guide to Optical Lithography Simulation", C. Mack, *FINLE Technologies, Inc.*, 2nd ed., 1997). Typically one uses the term focal plane deviation (FPD) to measure the extent of lens or system dependent focal error over the entire lithographic imaging field, lithographic systems with low to moderate amounts of focal plane deviation typically image better than those with gross amounts of focal plane deviation. Typically, the focal plane deviation associated with a photolithographic stepper or scanner is measured with some type of special lithographic imaging technique using special reticle or mask patterns. See "Distinguishing Dose from Defocus for In-Line Lithography Control", C. Ausschnitt, *SPIE*, Vol. 3677, pp. 140–147, 1999; "Understanding Optical End of Line Metrology", D. Ziger et al., *SPIE Optical Eng.*, Vol. 39(07), pp. 1951–1957, 2000; "Controlling Focal Plane Tilt", S. Hsu et al., *Semiconductor International*, Apr. 1, 1999 (available via Internet at the URL of [www.reed-electronics.com/semiconductor/toc/4%2F1%2F1999]) and "Focus Monitor for Alternating Phase Shift Masks", L. Liebmann et al., U.S. Pat. No. 5,936,738 issued Aug. 10, 1999.

While some focusing error is usually due to lens aberration, some is due to stage non-flatness, stage tilt, wafer tilt, wafer surface irregularities, and scanner noise. Traditional methods tend to estimate the overall magnitude of FPD but fail to account for scanner noise. In addition, most techniques cannot separate the FPD error into systematic and random portions (see, for example, "Controlling Focal Plane Tilt", supra)—which is important for process control applications.

General Overview of Control Theory

Important aspects of control theory and methods related to semiconductor process control will next be briefly reviewed in relatively general terms. The idea of controlling a process or event is typically described in one of two ways: classical or modern. See, for example, "Feedback Control of Dynamic Systems", G. Franklin et al., *Addison Wesley Pub.*, p. 312, 1986. The term classical is generally used for those methods typically employing transfer-function based control algorithms. Modem control theory typically refers to those methods employing state-space control design and is quite suited for numerical techniques.

As semiconductor microprocessors have become more complex, so to are the methods for controlling the processes to fabricate them. In fact, advances in semiconductor process control—especially those related to photolithography—are vital in keeping manufacturing costs down, increasing transistor density, and improving overall circuit (microprocessor, DRAM, etc.,) and device (transistor) performance. See, for example, "2001 ITRS Roadmap", supra. Since photolithography and the photolithographic exposure tools (steppers and scanners) typically account for the largest portion of semiconductor manufacturing costs—due to machine costs and process complexity—it is important that the semiconductor industry continues to explore new methods for controlling and improving the lithographic process. Modern control methods, especially those methods of Kalman (see, for example, "Applied Optimal Control and Estimation", F. L. Lewis, *Prentice-Hall*, Chapter 1, 1992) that focus on dynamic behavior in the presence of noise disturbance, are very well suited for controlling the dynamic behavior of lithographic scanners. In fact, in control theory, Kalman formalized the notion of optimality in control theory by minimizing a very general quadratic generalized energy function. In estimation theory, Kalman introduced stochastic notions that applied to non-stationary time-varying systems, thus providing a recursive solution, the Kalman filter, for the least-squares approach first used by C. F. Gauss (1777–1855) in planetary orbit estimation. The Kalman filter is the natural extension of the Wiener filter to non-stationary stochastic systems. See, for example, "Applied Optimal Control and Estimation", supra.

Over the past thirty-some years, the microelectronics industry has experienced dramatic rapid decreases in critical dimension by constantly improving photolithographic imaging systems. Today, these photolithographic systems are pushed to performance limits. As the critical dimensions of semiconductor devices approach 50 nm, the overlay error requirements will soon approach atomic dimensions while the useable depth of focus will be reduced to <100 nm. See, for example, "Life Beyond Mix-and-Match: Controlling Sub-0.18 Micron Overlay Errors", T. Zavecz et al., *Semiconductor International*, July 2000, pp. 205–214; and "2001 ITRS Roadmap", supra. To meet the needs of next generation device specifications, new overlay and focus monitoring/control methodologies will need to be developed. In particular, overlay and focus monitoring/control methodologies that can accurately separate systematic and random effects and break them into assignable causes will greatly improve device process yields. See, for example, "A New Approach to Correlating Overlay and Yield", supra and "Controlling Focal Plane Tilt", supra. In particular, new overlay and focus methodologies that can be implemented into advanced process control or automated control loops will likely be most important. See "Comparisons of Six Different Intra-Field Control Paradigms in an Advanced Mix and Match Environment", J. Pellegrini, *SPIE*, Vol. 3050, pp. 398–406, 1997; "Characterizing Overlay Registration of Concentric 5× and 1× Stepper Exposure Fields Using Inter-Field Data", F. Goodwin et al., *SPIE*, Vol. 3050, pp. 407–417, 1997; and U.S. Pat. No. 5,303,002 to Yan, supra. Finally, another area where quantifying and correcting overlay error is of vital concern is in the production of next generation EUVL and EPL masks or reticles. See "2001 ITRS Roadmap", supra.

Thus, the continuous reduction in semiconductor feature size and improved circuit functionality continues to force semiconductor manufacturing facilities to develop ingenious methods to help contain skyrocketing fabrication costs—especially those associated with photolithography where reductions in image fidelity, positional alignment, and the lithographic process window can halt all development and production activities. Going forward, new methods for monitoring and controlling systematic overlay and focusing errors will help speed product ramp, drive down development costs, and improve product yields.

SUMMARY

In accordance with the invention, scanning synchronization error in a projection imaging system is controlled by obtaining one or more scanning synchronization error maps comprising a plurality of error components, obtaining one or more focal plane deviation (FPD) error maps comprising a plurality of error components, separating the one or more synchronization error map and one or more FPD error map error components into one or more repeatable and non-repeatable parts, converting the repeatable parts into one or more mathematical models that express the repeatable parts in mode correctable and uncorrectable terms. The lens distortion map data, scanning synchronization error map data, FPD error map data, and the one or more mathematical models can be placed into a database linked to a process controller that executes process control algorithms, and correcting scanner motion of the projection imaging system based on output from the process controller.

The method determines the FPD uniquely associated with scanning synchronization errors in the Z direction and utilizes any FPD determination methods (e.g., FOCAL, PSFM, ISI, etc. and especially ISI, because of its high accuracy), but with a special exposure sequence and possibly reduced transmission reticles to separate out the dynamic scan part of the FPD. As noted in co-pending U.S. patent application Ser. No. 10/252,020, entitled "Method and Apparatus for Self-Referenced Dynamic Step and Scan Intra-Field Lens Distortion" assigned to the assignee of the present application and incorporated herein in its entirety, the scanning synchronization error as it impacts overlay can be measured on a scan-for-scan basis. In addition, as described in co-pending U.S. patent application Ser. No. 10/833,781, "Apparatus and Process for Determination of Dynamic Scan Field Curvature", assigned to the assignee of the present invention and incorporated herein in its entirety, the dynamic focal plane deviation (FPD) of the scan divorced from the wafer flatness and lens field curvature effects can be measured. If these two techniques are used, the instantaneous scanner errors as measured by the reticle and wafer stage interferometers can be gathered. Error maps can then be generated and used to correct the scanner motion profile.

Other features and advantages of the present invention should be apparent from the following description of the preferred embodiments, which illustrate, by way of example, the principles of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows, taken in conjunction with the accompanying drawings in which:

DETAILED DESCRIPTION

Figure 2:
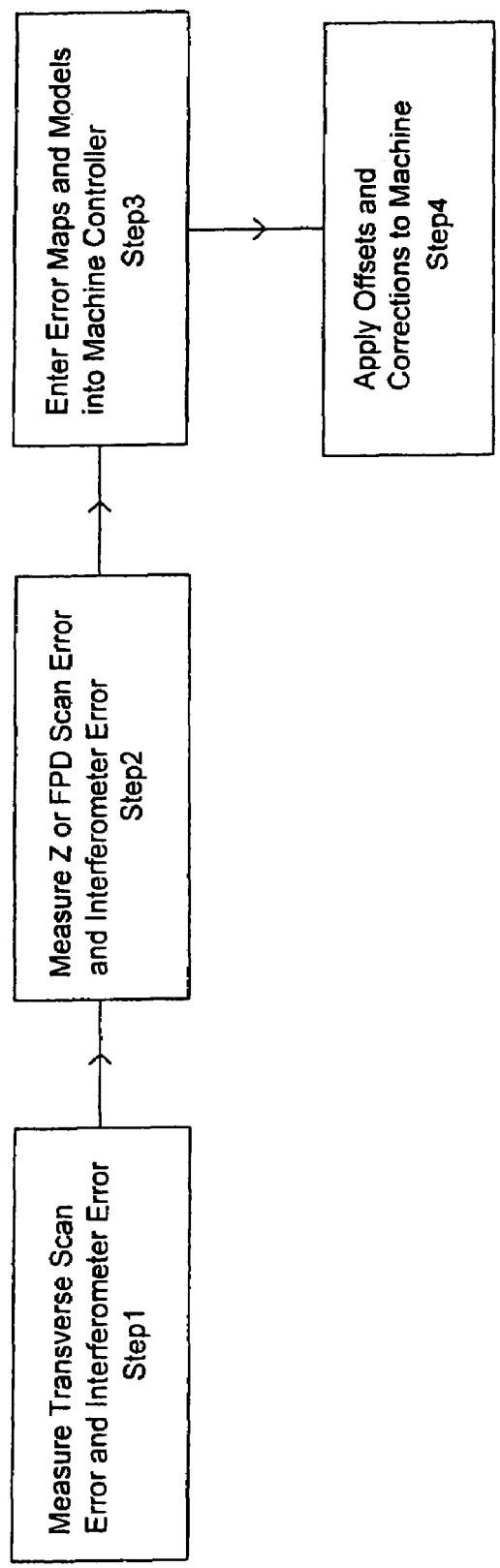
FIG. 2 shows the process flow for the present invention.

Apparatus and methods for obtaining, correcting, and controlling both focal plane deviation error (Z error) and transverse scanning distortion (X,Y scanning synchronization error) in the presence of scanner noise and wafer/stage irregularities are described. The process flow for one embodiment is diagramed in FIG. 2.

A better understanding of the present invention will be gained by knowledge of three related areas, which will be described in Parts I–III below.

Part I of Related Art: Determining Intra-Field Lens Distortion Error-Maps

Most semiconductor manufacturing facilities use some version of the following rather simple overlay procedure to estimate the magnitude of intra-field lens distortion, independent of other sources of systematic overlay error. See "Analysis of Image Field Placement Deviations of a 5× Microlithographic Reduction Lens", D. MacMillen et al., SPIE, Vol. 334, pp. 78–89, 1982. In fact, the technique is used for both photolithographic steppers and scanners. First, a matrix of large box-in-box overlay targets are exposed at a desired position on the wafer. Second, the stepper or scanner's reticle blades are adjusted to cover all but one small reticle overlay box target (usually located at the center of the test reticle where it is assumed the reticle is free of aberrations). Next, with the assumption that the stage moves perfectly, exposures are made at the center of each larger box-in-box target. The resulting box-in-box overlay targets are then measured with a standard optical overlay tool to measure the degree of alignment for each overlapping exposure. Since the second overlapping exposures are placed perfectly (an assumption) at the center of the larger box targets, any deviation in the relative position between the targets is interpreted as intra-field lens distortion. The last step in the technique is to create a distortion map of the lens using modeling equations and various least square regression techniques. See, for example, Super Sparse Overlay Sampling Plans: An Evaluation of Methods and Algorithms for Optimizing Overlay Quality Control and Metrology", supra; and "Analysis of Image Field Placement Deviations of a 5× Microlithographic Reduction Lens", supra.

A problem with this standard technique is two-fold: first, it is standard practice to assume that the wafer-stage error is very small, randomly distributed, and can be completely accounted for using a statistical model. See "A 'Golden Standard' Wafer Design for Optical Stepper Characterization", K. Kenp et al., SPIE, Vol. 1464, pp. 260–266, 1991; "Matching Management of Multiple Wafer Steppers Using a Stable Standard and a Matching Simulator", M. van den Brink et al., SPIE, Vol. 1087, pp. 218–232, 1989; "Matching Performance for Multiple Wafer Steppers Using an Advanced Metrology Procedure", supra and "Analysis of Image Field Placement Deviations of a 5× Microlithographic Reduction Lens", D. MacMillen et al., SPIE, Vol. 334, pp. 78–89, 1982. In general, positional uncertainties in the wafer-stage introduces both systematic and random errors, and since the intra-field distortion is measured only in reference to the lithography tool's wafer-stage, machine to machine wafer-stage differences show up as inaccurate intra-field distortion maps.

Secondly, the assumption that lens distortion is zero at the center of the lens is incorrect. Furthermore, the models that are used to calculate the overlay error maps do not account for scanner synchronization error. See "Super Sparse Overlay Sampling Plans: An Evaluation of Methods and Algorithms for Optimizing Overlay quality Control and Metrology", supra.

Two suitable techniques for the determination of intra-field lens distortion (lens distortion error-maps) in the presence of scanner noise are described in the following documents: A. Smith, "Method and Apparatus for Self-Referenced Projection Lens Distortion Mapping", A. Smith et al., U.S. Pat. No. 6,573,986 issued Jun. 3, 2003 and "Method and Apparatus for Self-Referenced Dynamic Step and Scan Intra-field Lens Distortion", U.S. patent application Ser. No. 10/252,020 (Smith '020) filed Sep. 20, 2002, supra. These documents are incorporated herein by reference in their entirety.

Both of these documents involve, among other things, self-referencing overlay techniques that can be utilized with overlay metrology tools in a production environment to find the lens distortion in the presence of scanner dynamics. For diagnosing the intra-field scanner lens distortion (($\Delta Xsl(x)$, $\Delta Ysl(x)$)) in the presence of significant scanner non-repeatability, the Smith '986 Patent (U.S. Pat. No. 6,573,986 to Smith, supra) teaches the use of a special reticle that has reduced optical transmission that is multiply scanned, producing sub-E0 exposures on the wafer. The result is that the teachings of the Smith '986 Patent can be used to accurately determine the repeatable part of the scanner intra-field lens distortion. Techniques for determining the part of the non-repeatable intra-field distortion that changes from scan to scan, such as scanner y-magnification (see FIG. 1), are desired.

Another method, especially suited to application in scanners, is described in U.S. patent application Ser. No. 10/252,020 to Smith, supra. In the Smith '020 application, a reduced transmission reticle is not required to extract the lens distortion ($\Delta xL(x)$, $\Delta yL(xl)$). Rather, three or four specific dynamic exposures and a special algorithm enable extracting the dynamic lens distortion. The techniques described in both of these documents are incorporated by reference herein.

Part II of Related Art: Determining Intra-Field Scanning Distortion Error-Maps

Novel methods and apparatus for determining the dynamic distortion (synchronization) components ($\Delta XS(y)$, $\Delta YS(y)$, $\Delta YR(x,y)$) that are present in lithographic scanners are described by A. Smith in co-pending U.S. patent application Ser. No. 10/252,021 entitled "Method and Apparatus for Self-Referenced Dynamic Step and Scan Intra-field Scanning Distortion", assigned to the assignee of the present invention and incorporated herein in its entirety, where $\Delta XS(y)$ and $\Delta YS(y)$ represent the integrated average translational error associated with scanning dynamics, and $\Delta YR(x,y)$ is the integrated average scanning yaw error.

In one embodiment, a special reticle pattern is exposed over the full field that is to be characterized. The wafer is then rotated 90 degrees and one or more exposures over the same field are made. Box-in-box structures on the resulting developed wafer are then measured and together with a special mathematical algorithm are used to reconstruct the dynamic scanner distortion (synchronization) error-map to within a translation, y-scale, and scan skew. The output of this embodiment is scanning synchronization error for a single scan, which is a combination of repeatable and non-repeatable parts. The repeatable portion is also useful and can be determined either from averaging results of multiple, single scan runs or by multiple exposures using a reduced transmission reticle, which outputs the repeatable portion of the transverse scanning synchronization error.

Part III of Related Art: Determining Focus and Focal Plane Deviation (FPD) Error-Maps Another technique related to the present invention relates to determining the FPD (Focal Plane Deviation or focus error across the field) associated with a photolithographic projection system, wafer-stage, reticle-stage, and substrate (wafer). Three industry standard methods, FOCAL (see, for example, "Controlling Focal Plane Tilt", supra), PSFM ("Detailed Study of a Phase-Shift Focus Monitor", G. Pugh et al,. *SPIE*, Vol. 2440, pp. 690–700, 1995), and Schnitzls ("Distinguishing Dose from Defocus for In-Line Lithography Control", supra) can be used to determine best focus and focal plane deviation (FPD) associated with the lithographic process. Each technique is described in several semiconductor trade magazines, journals, and U.S. Patents. See, for example, "Detailed study of a phase-shift focus monitor", supra; "Optical Focus Phase Shift Test Pattern, Monitoring system and Process", Brunner et al., U.S. Pat. No. 5,300,786 issued Apr. 5, 1994; and "Controlling Focal Plane Tilt", S. Hsu et al., *Semiconductor International*, Apr. 1, 1999 (available via Internet at the URL of [www.reed-electronics.com/semiconductor/toc/4%2F1%2F1999]). Other techniques for determining best focus and possibly FPD include: OELM (see, for example, "Understanding Optical End of Line Metrology", supra) and FEM matrix evaluation (see, for example, "Comprehensive Guide to Optical Lithography Simulation", supra).

Another method is described in "Apparatus, Method of Measurement, and Method of Data Analysis for Correction of Optical System", Smith et al., U.S. Pat. No. 5,828,455 issued Oct. 27, 1998; "Apparatus Method of Measurement and Method of Data Analysis for Correction of Optical System", Smith et al., U.S. Pat. No. 5,978,085 issued Nov. 2, 1999, both of which are incorporated herein by reference in their entirety. An In-situ Interferometer (ISI) with large aperture plate hole and lower density box array for measuring low order aberrations is described in these references. This is in addition to apparatus for measuring high order lens aberrations.

Figure 1:
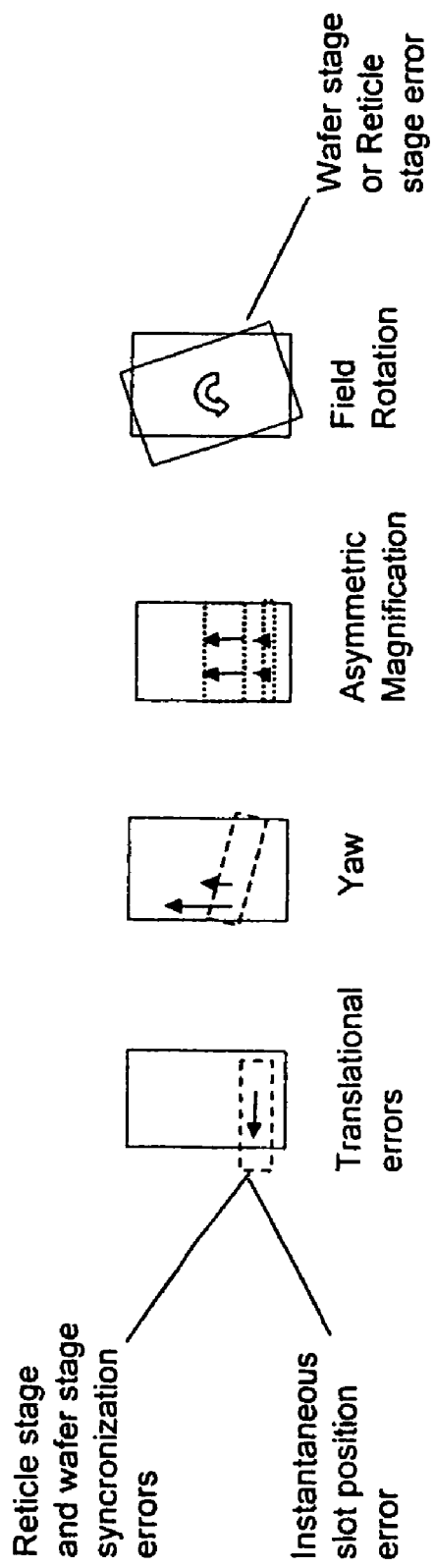
FIG. 1 shows typical scanner intrafield and interfield transverse error sources.

In general terms, each of these techniques estimates the focal error across the field (FPD) using a variety of special reticle patterns, interferometric devices, mirrors, sensors, common industry rules of thumb and statistical models. Some techniques, such as the Schnitzl (see, for example, "Distinguishing Dose from Defocus for In-Line Lithography Control", supra), FEM matrix (See, for example, "Comprehensive Guide to Optical Lithography Simulation", supra) and ISI (U.S. Pat. No. 5,828,455 supra; and U.S. Pat. No. 5,978,085 supra) determine both the magnitude and direction of focal offset, while others (OELM, "Understanding Optical End of Line Metrology", supra) cannot, without additional modifications and assumptions. In addition, each of these methods (with exception of ISI) utilizes the stepper or scanner wafer-stage leveling and positioning system and/or optical alignment system to aide in the determination of focus or FPD. FIG. 1 shows a typical photolithographic leveling system. None of these techniques, taken by themselves, can distinguish or separate out lens field curvature, wafer flatness, and scan induced height variations from one another. Their output is the sum of these effects.

To separately extract scanner synchronization errors from wafer-stage non-flatness, and wafer irregularity (z-focusing error $\Delta ZS(x, y)$, FPD error-map), the technique described in "Process for Determination of Lens Field Curvature", A. Smith et al., supra is helpful. This technique allows for determination of the dynamic lens field curvature divorced from wafer flatness and scanning height variation effects. It involves a special exposure pattern applied to the FPD method (e.g., FOCAL, PSFM, OELM, FEM, ISI, etc.) and special subsequent data processing techniques.

Background

Figure 5:
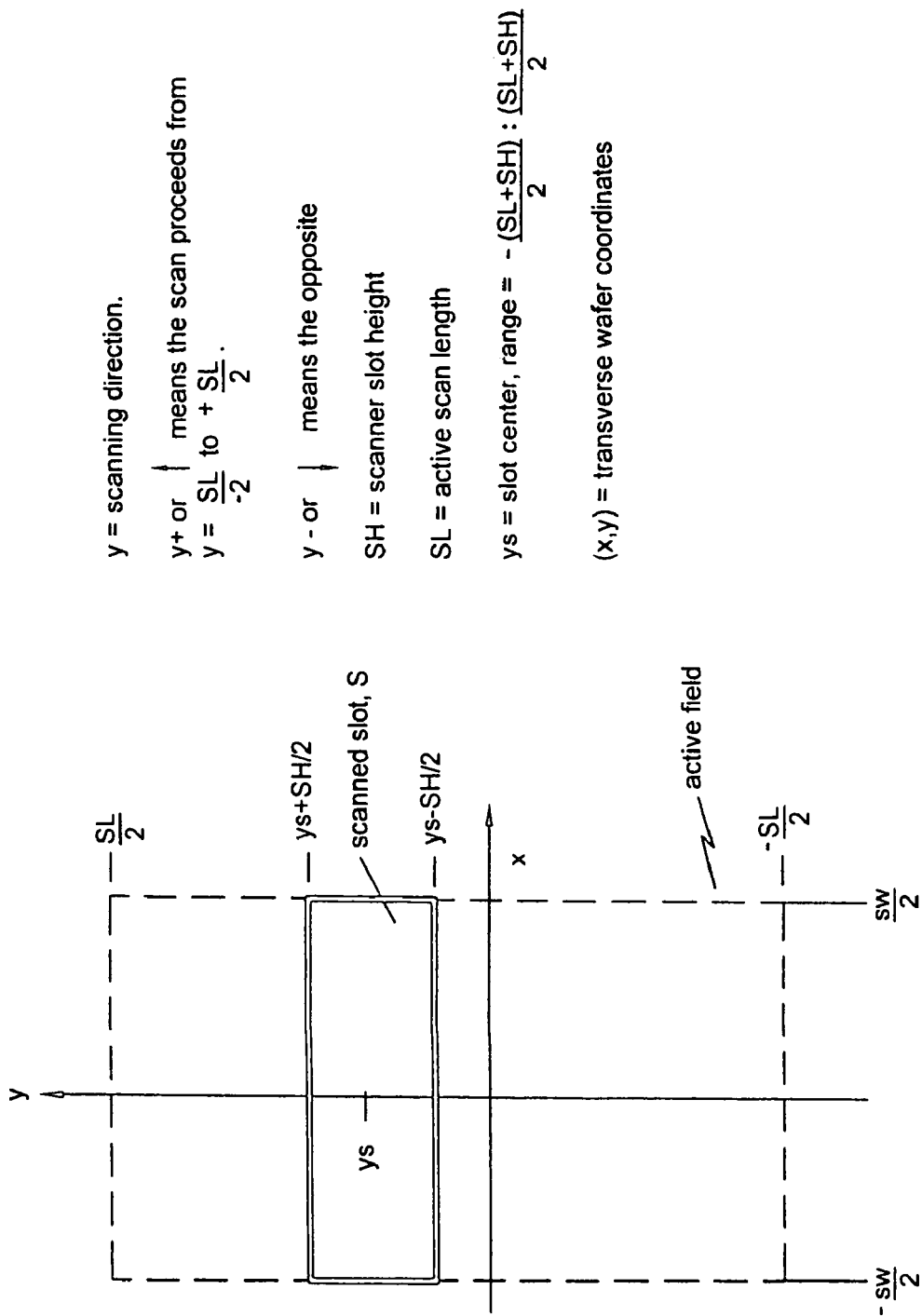
FIG. 5 shows the geometry and notation for a rectangularly scanned slot.

FIG. 5 shows the geometry of a rectangular scanned slot S in relation to the wafer. As the slot is scanned, there will be an instantaneous synchronization error between the wafer stage and reticle stage that will result in a relative displacement in x, y, and z of the wafer from its ideal or best position. See "Step and Scan and Step and Repeat, a Technology Comparison", M. van den Brink et al., *SPIE*, Vol. 2726, pp. 734–753; and "Micrascan(™) III Performance of a Third Generation, Catadioptric Step and Scan Lithographic Tool", D. Cote et al., *SPIE*, Vol. 3051, pp. 806–816, 1997.

Figure 6:
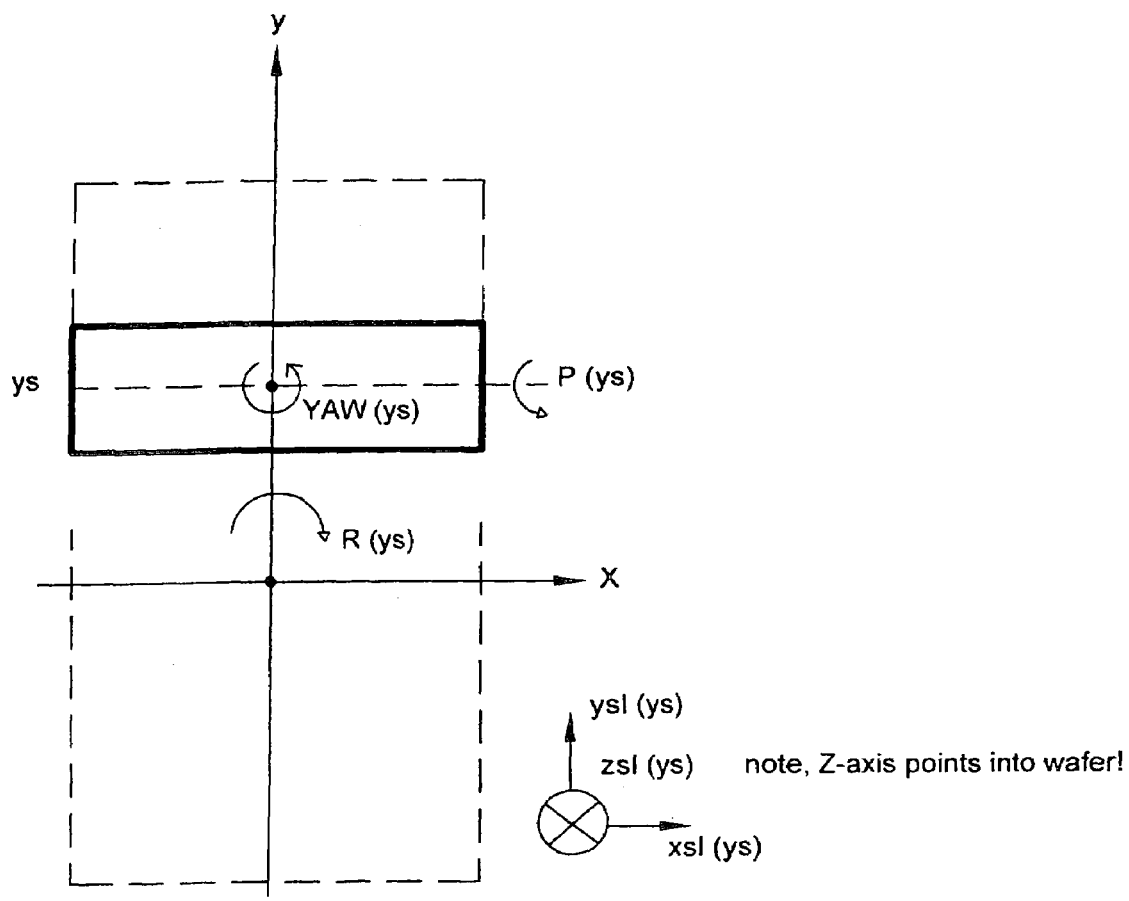
FIG. 6 shows the geometry of rigid body modes that make up instantaneous scanner synchronization.

The instantaneous synchronization error may be caused by the six rigid body modes that consist of three translational and three rotational or three transverse and three Z modes. The following discussion addresses all six rigid body modes, however, fewer than the six modes may be used depending on the error of interest. FIG. 6 diagrams the six modes, while Table 1 delineates their X, Y, Z contribution to synchronization error. Table 1 lists the rigid body modes contributing to scanner synchronization error:

TABLE 1

Rigid Body Modes and their X, Y, Z Contribution to Scanner Synchronization Error

| Mode | X-slip | Y-slip | Piston or Z-slip | Yaw | Pitch | Roll |
|---|---|---|---|---|---|---|
| Symbol | xsl | ysl | zsl | YAW | P | R |
| Translational | ✓ | ✓ | ✓ | | | |
| Rotational | | | | ✓ | ✓ | ✓ |
| Transverse | ✓ | ✓ | | ✓ | | |
| Z | | | ✓ | | ✓ | ✓ |
| Δ X (x, y, ys) | xsl(ys) | 0 | 0 | −YAW(ys) · (y − ys) | 0 | 0 |
| Δ Y (x, y, ys) | 0 | ysl(ys) | 0 | YAW(ys) · x | 0 | 0 |
| Δ Z (x, y, ys) | 0 | 0 | zsl(ys) | 0 | −P(ys) · (y − ys) | R(ys) · x |

Figure 7:
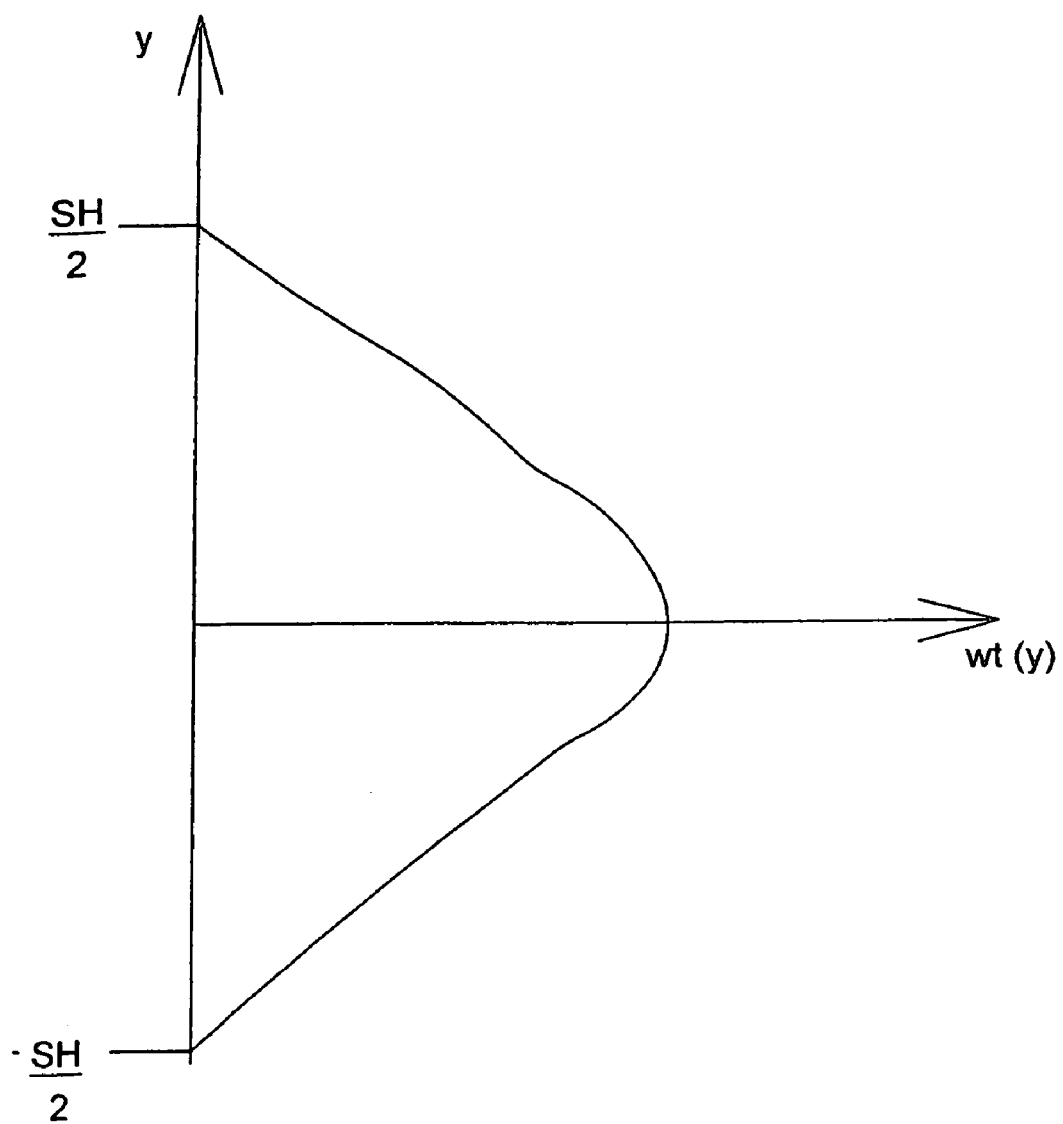
FIG. 7 shows the weight function for determining average error.

In Table 1, $(\Delta X, \Delta Y, \Delta Z)(YS; X,Y)$ is the instantaneous influence of scanner synchronization error on the point (X,Y) in the scan field when the scan center is at ys (see FIG. 6). To compute the influence of these instantaneous errors on feature placement (X,Y) and focus (Z), the weight function along the slot direction (see FIG. 7) must be known. In chemically amplified photoresists, wt(y) is proportional to the illumination intensity along the slot, but for Novolak type photoresists, it will also depend on the saturable absorption. Therefore, and in general, wt(y) will depend on the scan direction (see FIG. 5), as well as the intensity profile.

At this point, the combined shift $(\delta X_s, \delta Y_s)$ and focus $(\delta Z_s)$ error in terms of the instantaneous error can be written as:

$$(\delta X_s, \delta Y_s, \delta Z_s)(x, y) = \quad \text{(Equation 1)}$$
$$\frac{1}{W}\int_{y-\frac{SH}{2}}^{y+\frac{SH}{2}} dy_s\, wt(y-ys) * (\Delta X, \Delta Y, \Delta Z)(ys; x, y)$$

where $$W = \int_{-SH/2}^{SH/2} dy'\, wt(y')$$

and $(\Delta X, \Delta Y, \Delta Z)$ is the sum of all components listed in Table 1.

The transverse scanner synchronization error $(\delta X_s, \delta Y_s)(x, y)$ can then be derived as follows:

$$(\delta X_s, \delta Y_s)(x, y) = (\Delta XS(y), \Delta YS(y) + x * \theta S(y)) \quad \text{(Equation 2)}$$

where:

$$\Delta XS(y) = \frac{1}{W}\int_{-\frac{SH}{2}}^{\frac{SH}{2}} dy'\, wt(y')(xsl(y-y') - y' * YAW(y-y')) \quad \text{(Equation 3)}$$

$$\Delta YS(y) = \frac{1}{W}\int_{-\frac{SH}{2}}^{\frac{SH}{2}} dy'\, wt(y')\, ysl(y-y') \quad \text{(Equation 4)}$$

$$\theta S(y) = \frac{1}{W}\int_{-\frac{SH}{2}}^{\frac{SH}{2}} dy'\, wt(y') * YAW(y-y') \quad \text{(Equation 5)}$$

In like manner, we get for the focus contribution of the scanner synchronization error:

$$\delta Z_s(x, y) = \Delta ZS(y) + x * \theta R(y) \quad \text{(Equation 6)}$$

where:

$$\Delta ZS(y) = \frac{1}{W}\int_{-\frac{SH}{2}}^{\frac{SH}{2}} dy'\, wt(y')\, [zsl(y-y') - y' P(y-y')] \quad \text{(Equation 7)}$$

$$\theta R(y) = \frac{1}{W}\int_{-\frac{SH}{2}}^{\frac{SH}{2}} dy'\, wt(y')\, R(y-y') \quad \text{(Equation 8)}$$

To summarize, the transverse and Z-distortion have been expressed as suitable combinations of the weighted moving averages of the instantaneous distortion. Equations 3–5 for transverse and Equations 6–8 for Z-distortion.

FIRST MAIN EMBODIMENT

Determination of Dynamic Synchronization Error-Maps

At appropriate time intervals (as determined by a process controller, or fabrication facility procedures) we use a method to determine the transverse dynamic scanning distortion errors (scanning synchronization error-map—step 1, FIG. 2) using the following operations.

Dynamic Step and Scan Distortion Measurement (Step 1)

One method of determining a scanning synchronization error-map is described in "Method and Apparatus for Self-Referenced Dynamic Step and Scan Intra-Field Scanning Distortion", A. Smith et al., U.S. patent application Ser. No. 10/252,021 filed on Sep. 20, 2002. In addition, Smith recommends using: "In-Situ Source Metrology Instrument and Method of Use", A. Smith et al., U.S. Pat. No. 6,356,345 issued Mar. 12, 2002, to find the integrated average lens distortion ($\Delta xL(x)$, $\Delta yL(x)$). Although the lens components are rather stable, the information can be used to separate lens error from synchronization error. In addition, there is no certainty that the lens remains forever the same—lens heating or other damage could change these errors and all lens errors should be tracked.

While executing the exposures required by this technique (see, for example, "Method and Apparatus for Self-Referenced Dynamic Step and Scan Intra-Field Scanning Distortion", supra), the actual interferometer transverse error signals (Xsl(ys), Ysl(ys) and YAW(ys)) that represent the actual recorded synchronization error between wafer and reticle stage are recorded. This is directly obtainable from the scanner hardware. For example, the y wafer stage position as a function of ys (the nominal slot center position) will be directly output by the y interferometer channel of the wafer stage (FIG. 8) as y_w(ys) while the y reticle stage position (FIG. 9) comes from the y interferometer channel as y_R (ys). The net y slip error in the wafer plane is then just:

$$ysl(ys) = y\_w(ys) - y\_R(ys)/M \quad \text{(Equation 9)}$$

where:

M=machine reduction magnification ratio (typically 4). In like manner we accumulate the x-slip error Xsl(ys), while the YAW error is:

$$YAW(ys) = YAW\_w(ys) - YAW\_R(ys) \quad \text{(Equation 10)}$$

So, at the conclusion of this step we have:

Transverse scanning synchronization error on N fields:

$$(\Delta XS, \Delta YS, \theta S)(y, \text{if}=1:N) \quad \text{(Equation 11)}$$

and the interferometer instantaneous transverse error signals on the same N fields:

$$(xsl, ysl, YAW)(ys, \text{if}=1:N) \quad \text{(Equation 12)}$$

Scanning FPD Error (Step 2)

For this step (Step 2 in FIG. 2) we measure or otherwise collect the scanner FPD error and corresponding scanner interferometer signals.

The dynamic scan focal plane deviation ($\Delta ZS(y)$, $\theta R(y)$) of Equation 6) is determined for N scans along with the instantaneous scanner error in piston, roll, and pitch (zsl (ys) R(ys), P(ys)).

One method for obtaining $\Delta ZS$, $\theta R$ is described in "Process for the Determination of Dynamic Scan Field Curvature", supra. It has the distinct advantage of divorcing the wafer flatness effects from the scan dynamics. Again, while executing the required exposures the actual interferometer error signals for piston, roll, and pitch are simultaneously output from the hardware. To reduce the Z reticle, Z_R(ys), and Z wafer, Z_w(ys), positions we use:

$$zsl(ys) = Z\_w(ys) - Z\_R(ys)/M^2 \quad \text{(Equation 13)}$$

while for pitch (P) and roll (R), straight subtraction without any factors of 1/M is used. So, at the conclusion of this step, we have Z-scanning synchronization error on N fields:

$$(\Delta ZS, \theta R)(y, \text{if}=1:N) \quad \text{(Equation 14)}$$

The interferometer Z-error signals on the same N fields:

$$(zsl, R, P)(ys, \text{if}=1:N) \quad \text{(Equation 15)}$$

are also known at the conclusion of this step.

Error Map and Model (Step 3)

At this point, we determine the low frequency scanner interferometer error for both transverse and Z components.

Scanner Interferometer Error

Having gathered true transverse scanning synchronization using, for example, using the method described in co-pending U.S. patent application Ser. No. 10/252,021 entitled "Method and Apparatus for Self-Referenced Dynamic Step and Scan Intra-Field Scanning Distortion" (DIMS), assigned to the assignee of the present invention and incorporated herein in its entirety, and having also obtained the machine internal interferometer error signals, we know the transverse error quantities represented on both left-hand side (LHS) and right-hand side (RHS) of Equations 3–5. So, for example we should have:

$$\Delta YS(y, \text{if}) = \frac{1}{W} \int_{-\frac{SH}{2}}^{\frac{SH}{2}} dy' wt(y') \, ysl(y - y', \text{if}) \quad \text{(Equation 16)}$$

for if =1:N to within measurement accuracy.

Figure 3:
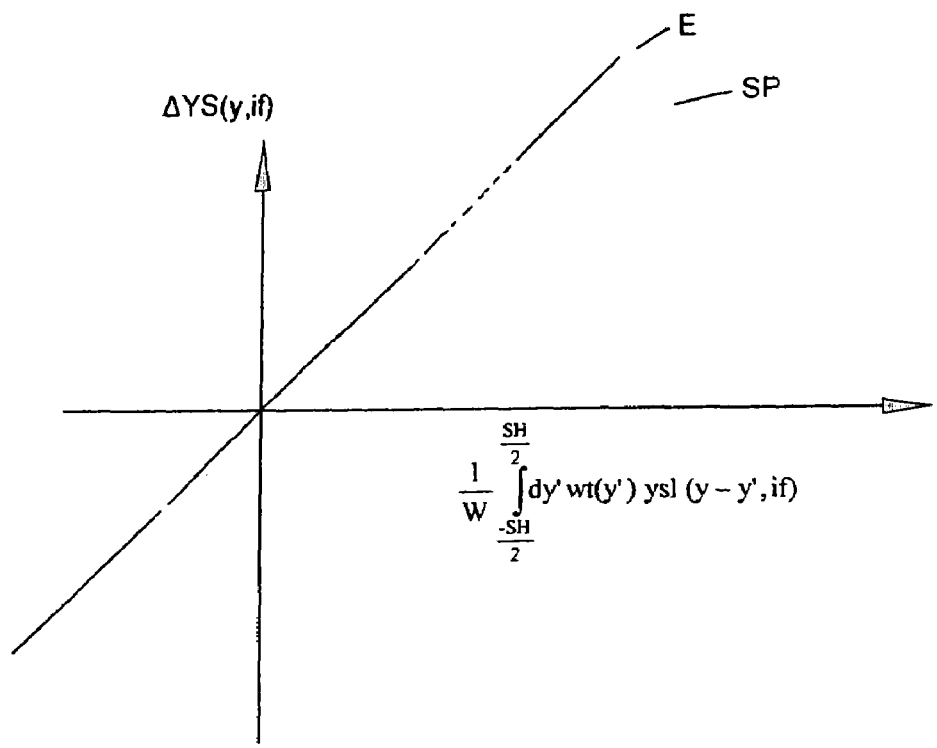
FIG. 3 shows one example of error in an interferometer signal.
Figure 4:
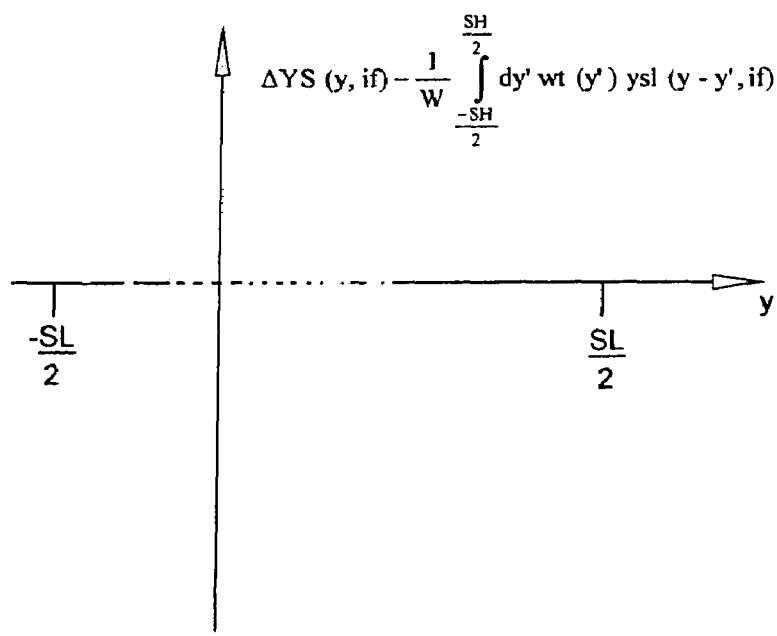
FIG. 4 shows an example of bias in an interferometer signal.

Similarly for the Z-components of error, Equations 7 and 8 should hold to within measurement error. The simplest comparison, and using Equation 16 as an example, would plot the LHS and RHS on separate axes and look for significant deviation from a straight line drawn at 45° and passing through the origin (see FIG. 3). There the discrete values of $\Delta YS$ (y, if) measured by DIMS (LHS of Equation 16) are plotted against the moving average of the interferometer error signal ysl (RHS of Equation 16) and represented as the scattered points, SP. To the extent there is statistically significant deviation from the equality line, E, we have identified a problem with the interferometer system of the machine under investigation. FIG. 4 shows another example where the LHS-RHS of Equation 16 is plotted versus the scan coordinate. Statistically significant deviation from the horizontal axis is indicative of an error in the interferometer system. These two examples are exemplary only, there are many data analysis techniques (ANOVA, Factor Analysis, etc, "Statistical Textbook", supra) we can apply to the differences of the LHS and RHS of Equations 3–5, 7 and 8 to ascertain the statistical significance of the difference.

Equivalent Error Maps

To characterize and correct for low frequency instantaneous interferometer error terms we need to represent the actual measured shifts $\Delta XS$, $\Delta YS$, $\Delta ZS$, $\theta S$, $\theta R$ as equivalent instantaneous errors xsl_e, ysl_e, zsl_e, YAW_e, P_e, R_e. For example:

$$\Delta YS(y, \text{if}) = \frac{1}{W} \int_{-\frac{SH}{2}}^{\frac{SH}{2}} dy' wt(y') \, ysl\_e(y - y', \text{if}) \quad \text{(Equation 17)}$$

defines ysl_e as the equivalent instantaneous error.

Equation 17 can be directly solved via Fourier deconvolution or reformulated directly as an ordinary matrix inversion problem if we expand ysl_e(y) in a spatially band limited function series (e.g., discrete sines/cosines, or orthogonal polynomials of limited order). The highest spatial frequency, fc, allowed corresponds to approximately one cycle across the slot or $$\left| \frac{1}{W} \int_{-\frac{SH}{2}}^{\frac{SH}{2}} dy' wt(y') \cos(2\pi f_c y') \right| \square \, 0.10 \quad \text{(Equation 18)}$$

Here fc, the cutoff frequency, is the smallest (positive) value which satisfies Equation 18.

The solutions for YAW_e and R_e will follow similar lines to Equation 17 while xsl_e will first require the solution YAW_e. zsl_e and P_e require a separate discussion.

$$\Delta ZS(y, \text{if}) = \quad \text{(Equation 19)}$$
$$\frac{1}{W} \int_{-\frac{SH}{2}}^{\frac{SH}{2}} dy' wt(y') \, [zsl\_e(y - y', \text{if}) - y' P\_e(y - y', \text{if})]$$

Since in the spatial frequency regime of interest f=−fc:fc, the P_e term is a relatively small contributor, we ignore it entirely and solve for Zsl_e from Equation 19 sans the P_e term, e.g., $$\Delta ZS(y, if) = \frac{1}{W}\int_{-\frac{SH}{2}}^{\frac{SH}{2}} dy' wt(y') zsl\_e(y - y', if) \quad \text{(Equation 20)}$$

$$P\_e = 0 \quad \text{(Equation 21)}$$

To summarize, at this point we will have reduced our observed scan results or measured shifts to equivalent instantaneous error maps:

(xsl_e, ysl_e, zsl_e, YAW_e, P_e, R_e)(y, if =1:N)      (Equation 22)

as well as having the actual machine interferometer generated error maps for N scans or fields:

(xsl, ysl, zsl, YAW, P, R)(y, if=1:N)      (Equation 23)

Error Maps and Models (Step 4)

Figure 8:
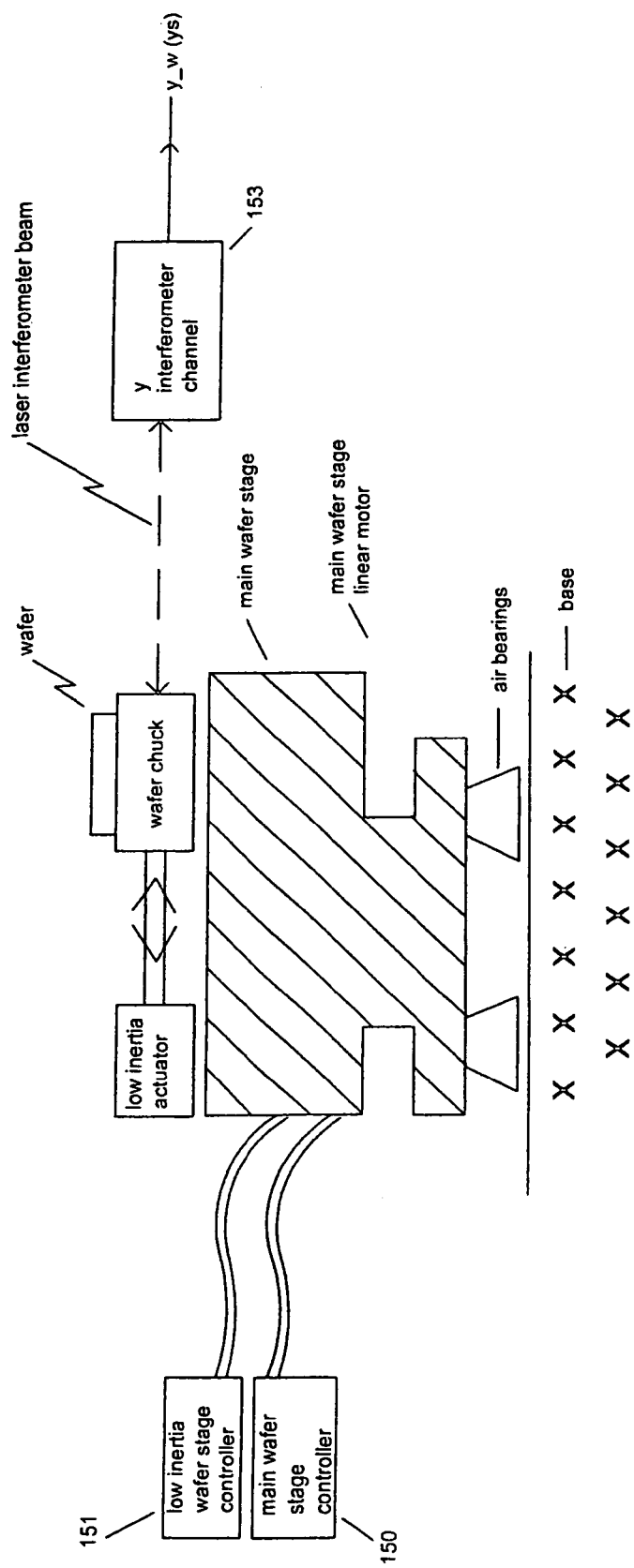
FIG. 8 shows a schematic of wafer stage mechanics with y-axis actuators and interferometer.
Figure 9:
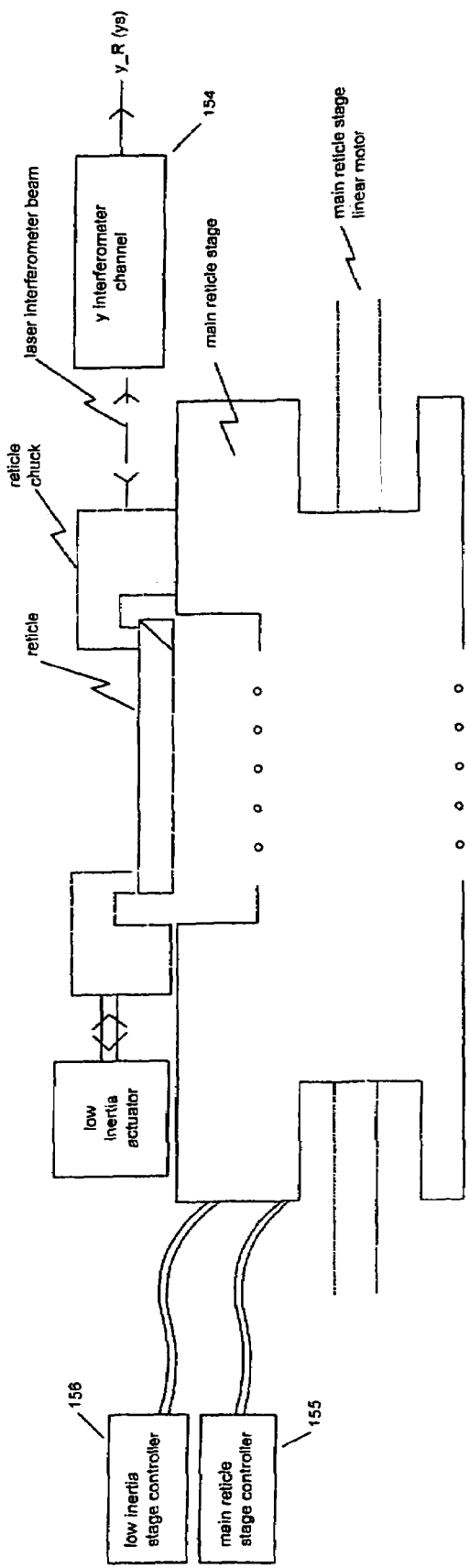
FIG. 9 shows a schematic of reticle stage mechanics with y-axis actuators and interferometer.

At this point we formulate the error maps into various models that will be entered into the wafer or reticle stage controllers (FIGS. 8 and 9).

Figure 10:
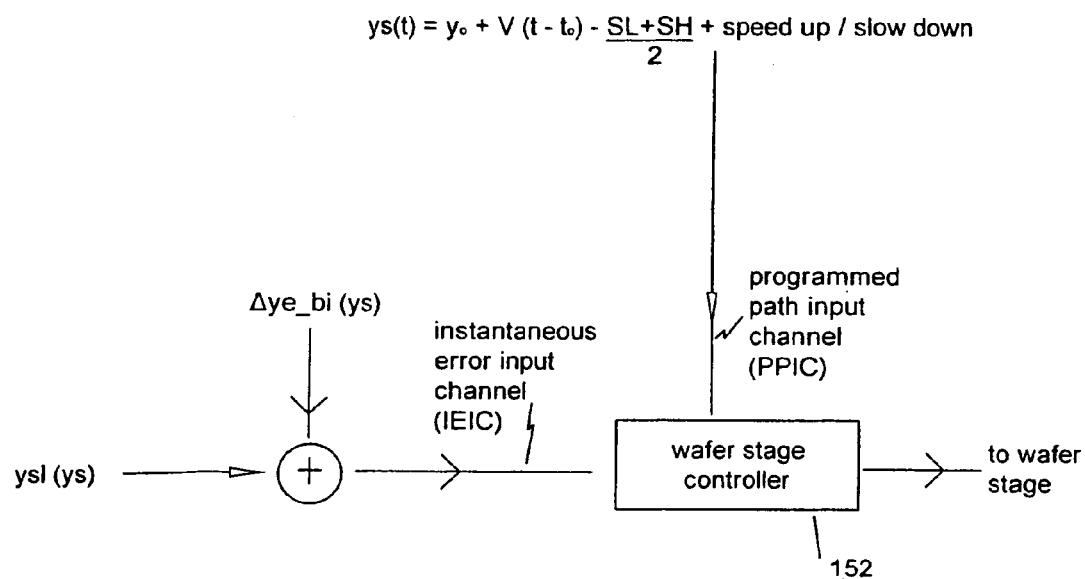
FIG. 10 shows removal of bias from the instantaneous interferometer signal.

A wafer stage controller typically includes two parts, a main wafer stage controller 150 that controls the high-mass, high-speed wafer motion, and a low inertia wafer stage controller 151 that controls low-mass, low-speed, high bandwidth wafer chuck motion. In practice, these two controllers and subsystems could be combined into one component. FIG. 10 shows a wafer stage controller 152 (which could be implemented as a low inertia controller 151, main stage controller 150, or a combination of both) with two inputs, a PPIC or programmed path interface channel, and an IEIC or instantaneous error input channel, and one output to the wafer stage (any amplifiers are contained in the controller). The PPIC takes in the nominal stage motion profile which in FIG. 10 (the y channel) includes data relating to constant velocity motion and required speedup and slowing down terms (required before start of scan and after end of scan). The controller 152 then provides signals to the linear motor for a force Fy(t):

$$m\frac{d^2}{dt^2}y_s(t) + \gamma\frac{d}{dt}y_s(t) + \omega_o^2 y_s(t) = Fy(t) \quad \text{(Equation 24)}$$

where the controller 152 already has the (simple) model values for the y-stage behavior of m=effective stage inertia γ=damping $\omega_0$=lowest effective resonant frequency.

The reticle stage controllers 155 and 156 would behave similarly. To move the stage with the required high precision, y-interferometer channels on the wafer 153 and reticle 154 stages are combined to create the error signal $ysl(ys) = y\_w(ys) - y\_R(ys)/M$      (Equation 25)

that is fed into the IEIC (FIG. 10) and this feedback is utilized to correct y-axis stage motion. Now, and to the extent it is significant, if there is a bias that depends on intrafield scan position y (FIG. 4) then we can correct for it by adding this bias from the instantaneous error signal ysl(ys) the bias:

$$\Delta ye\_bi(ys) = \frac{1}{N}\sum_{if=1}^{N} ysl\_e(y_s, if) - [ysl(ys, if)]_{LP} \quad \text{(Equation 26)}$$

where ysl_e is the equivalent instantaneous error of Equation 17.

$[ysl(ys, if)]_{LP}$ is a low passed (passband J2*fc)      (Equation 27)

version of the corresponding slip.

Figure 11:
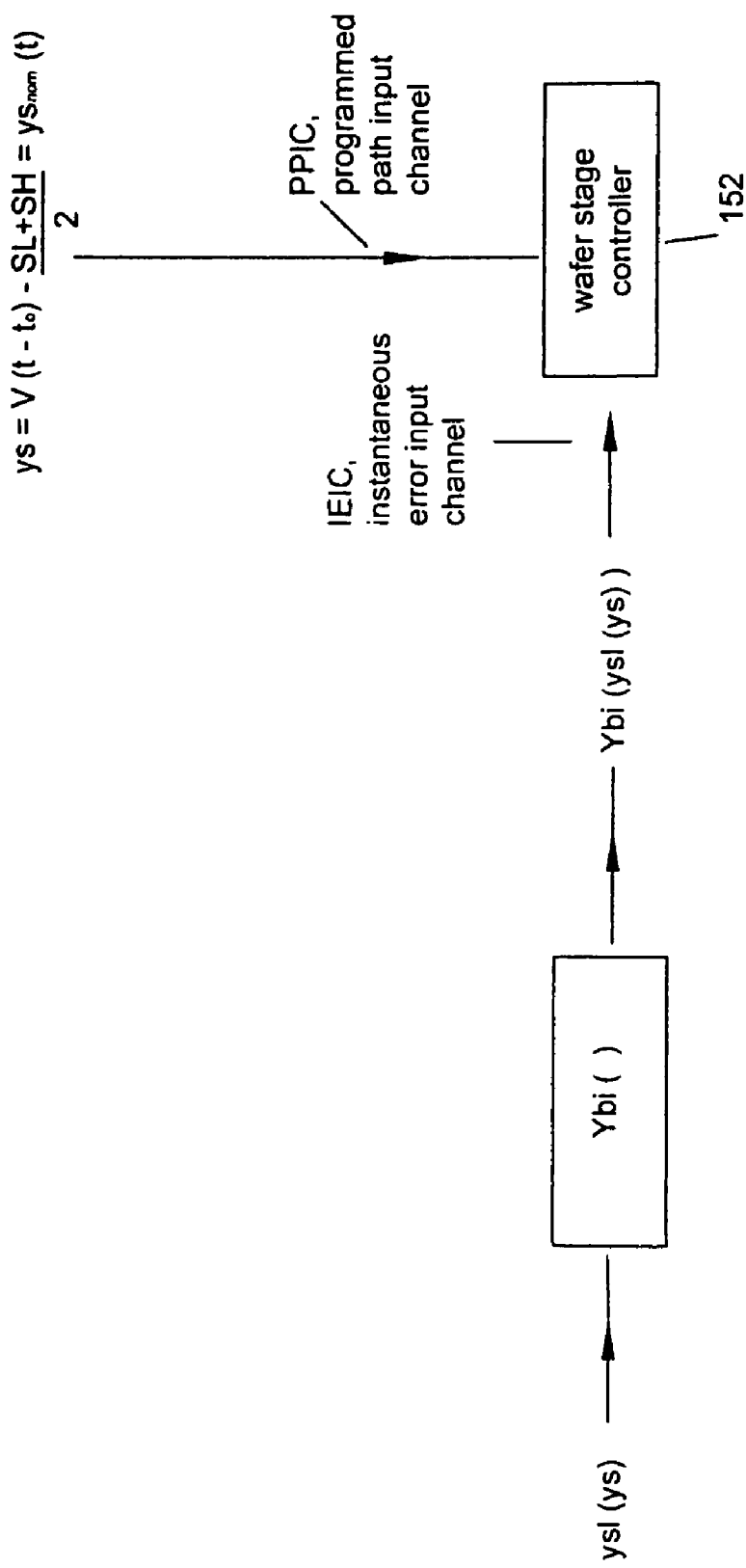
FIG. 11 shows a general non-linear mapping to remove bias in instantaneous interferometer error.

In another version, to the extent there is a significant lack of equality between ΔYS and the corresponding moving average of the instantaneous slip (FIG. 3), we would correlate the equivalent instantaneous error ysl_e (ys, if) with [ysl(ys, if)]_{LP} of Equation 27 as a general functional relation as follows:

$ysl\_e(ys,if) \approx Ybi([ysl(ys, if)]_{LP})$      (Equation 28)

and transform ysl before it enters the IEIC of the wafer stage (FIG. 11).

Figure 12:
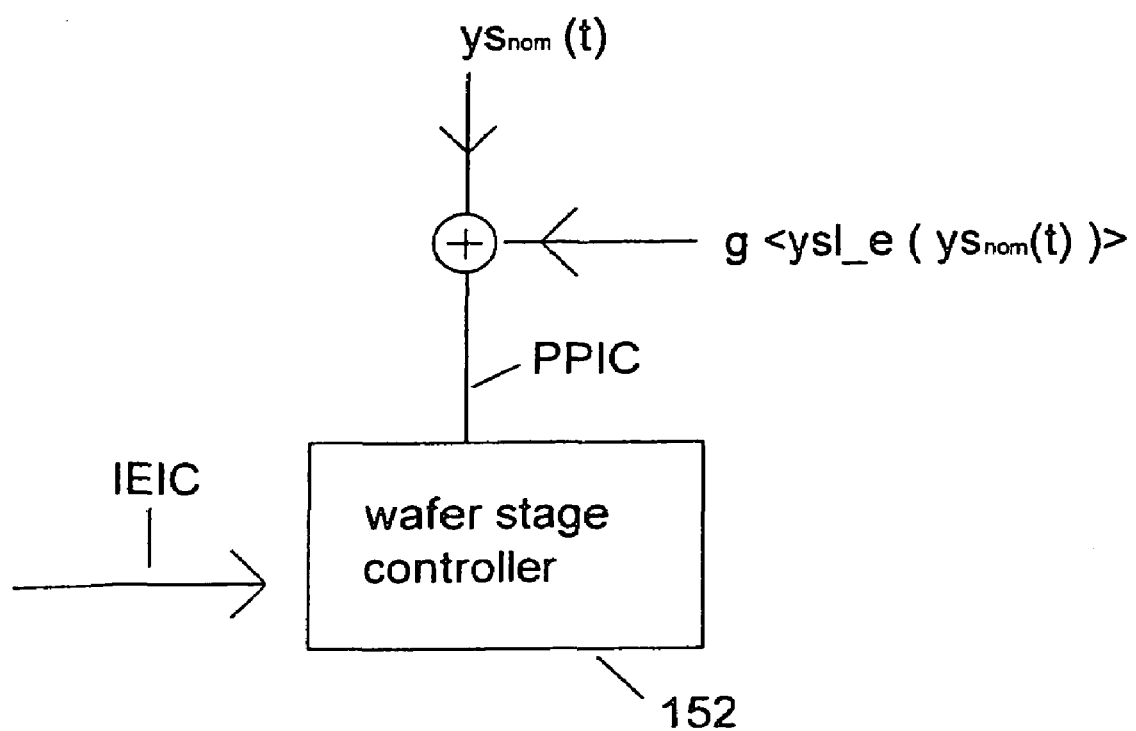
FIG. 12 shows a simple feed forward correction of systematic scanner error with variable gain g.

Yet another version of applying the error maps is shown in FIG. 12. There we correct for the repeatable part of the scanner error in the PPIC channel. This feed forward method is especially useful in that it generally requires less actuator bandwidth and it can be more advantageously apportioned between the low (151) and high (150) inertia stage controllers. This correction consists first of calculating the repeatable part (average) of ysl_e (y, if) in Equation 17 and putting:

$$\langle ysl\_e(y)\rangle = \frac{1}{N}\sum_{if=1}^{N} ysl\_e(y, if) \quad \text{(Equation 29)}$$

and then adding it to the nominal profile $ys_{nom}(t)$ with gain=g. Gain g is ideally −1 but can be tuned for optimum performance.

Figure 13:
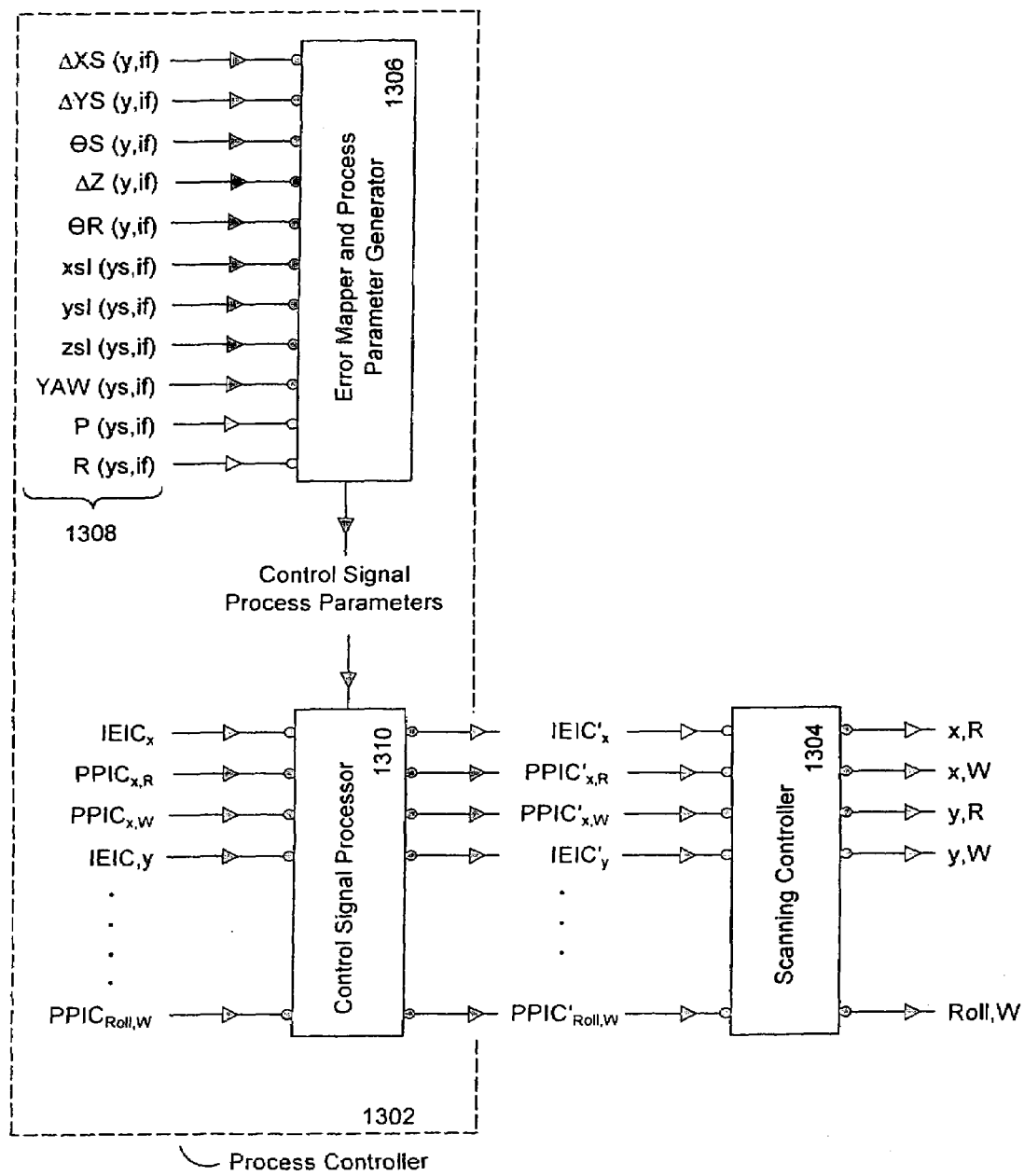
FIG. 13 shows a process controller that can be implemented to generate control signals for a scanning controller.

FIG. 13 shows a process controller 1302 that generates control signals for a scanning controller 1304. A processor 1306 for generating error maps and processor parameters may receive scanner synchronization errors and instantaneous errors 1308 and may then output control signals and processor parameters to a control signal processor 1310. The processor 1310 also receives desired control commands and outputs control signals to the scanning controller 1304.

While these techniques have been discussed separately, they could be combined and iterated upon to produce differing arrangements consisting of these basic components.

While the techniques illustrated by FIGS. 10, 11 and 12 were applied to the wafer stage controller, they also apply to the reticle stage controller (see FIGS. 8 and 9) or they could be apportioned between the two. For example, if the relation between synchronization error and instantaneous synchronization error is as illustrated in FIG. 4, this is most likely caused by errors arising in the reticle stage and is best corrected using the reticle controller.

So far, correcting the y-channel (Y-slip mode of Table 1) has been described in detail. With suitable adjustments, these results could also be applied to the X-slip, Z-slip, YAW, Pitch, or Roll modes of Table 1.

The present invention has been mainly described with respect to application on projection imaging tools, such as scanners that are commonly used in semiconductor manufacturing. See, for example, "Micrascan(™) III Performance of a Third Generation, Catadioptric Step and Scan Lithographic Tool", supra; "ArF Step and Scan Exposure System for 0.15 Micron and 0.13 Micron Technology Node", J. Mulkens et al., *SPIE Conference on Optical Microlithography XII*, pp. 506–521, March 1999; "0.7 NA DUV Step and Scan System for 150 nm Imaging with Improved Overlay", J. V. Schoot, *SPIE*, Vol. 3679, pp. 448–463, 1999. The methods of the present invention can be applied to other scanning projection tools, such as: 2-dimensional scanners (see, for example, "Large Area Fine Line Patterning by Scanning Projection Lithography", H. Muller et al., *MCM 1994 Proceedings*, pp. 100–104; "Optical Lithography—Thirty Years and Three Orders of Magnitude", J. Bruning, *SPIE*, Vol. 3051, pp. 14–27, 1997, and "Large-Area, High-Throughput, High-Resolution Projection Imaging System", K. Jain, U.S. Pat. No. 5,285,236 issued Feb. 8, 1994), office copy machines (see, for example, "Projection Optical System for Use in Precise Copy", T. Sato et al., U.S. Pat. No. 4,861,148 issued Aug. 29, 1989), and next generation lithography (ngl) systems such as XUV (see, for example, "Development of XUV Projection Lithography at 60–80 nm", B. Newnam et al., *SPIE*, Vol. 1671, pp. 419–436, 1992), SCALPEL, EUV (Extreme Ultra Violet) (see, for example, "Reduction Imaging at 14 nm Using Multilayer-Coated Optics: Printing of Features Smaller than 0.1 Micron", J. Bjorkholm et al., *Journal Vacuum Science and Technology* 8(6), pp. 1509–1513, Nov/Dec 1990), IPL (Ion Projection Lithography), and EPL (electron projection lithography) (see, for example, "Mix-and-Match: A Necessary Choice", supra).

Figure 14:
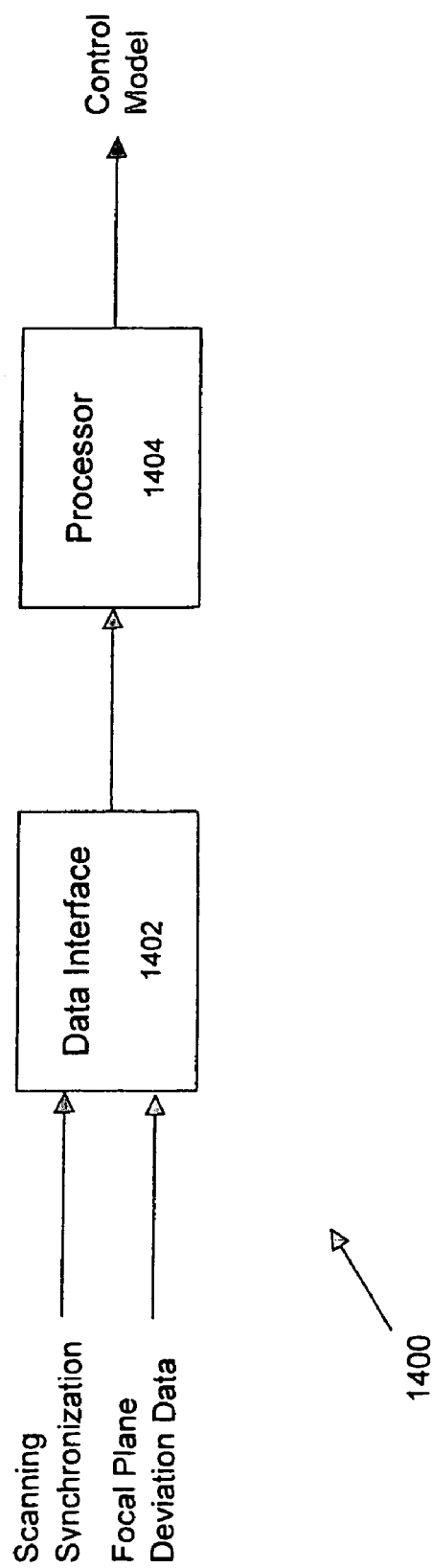
FIG. 14 shows a block diagram of an apparatus that can be used to determine scanning synchronization control models.

FIG. 14 is a block diagram of an apparatus 1400 that can be used to determine scanning synchronization control models for use by a process controller to correct scanner motion. The apparatus includes a data interface 1402 that receives scanning synchronization error data and focal plane deviation data of a scanning projection imaging system such as illustrated in FIG. 1. The apparatus also includes a processor 1404 that is configured to accept the scanning synchronization error data and focal plane deviation data from the data interface 1402. The processor then determines scanner error maps for the projection imaging system and outputs control models of the scanning projection imaging system based on the scanning synchronization error data and focal plane deviation data.

In one embodiment, the apparatus of FIG. 14 is a stand alone unit external to the projection imaging system while in other embodiments the apparatus of FIG. 14 is included within a projection imaging system. For example, the apparatus 1400 can be a component in the projection imaging system, such as when it is incorporated into the wafer stage controller, the reticle stage controller, a general purpose controller or processor or other component within the system. So far, the substrates on which the recording media is placed have been described as wafers. This will be the case in semiconductor manufacture. The exact form of the substrate will be dictated by the projection lithography tool and its use in a specific manufacturing environment. Thus, in a flat panel manufacturing facility, the substrate on which the photoresist would be placed would likely be a glass plate or panel. A mask-making tool would utilize a reticle as a substrate. Circuit board or multi-chip module carriers are other possible substrates.

The present invention has been described above in terms of a presently preferred embodiment so that an understanding of the present invention can be conveyed. There are, however, many configurations for the system and application not specifically described herein but with which the present invention is applicable. The present invention should therefore not be seen as limited to the particular embodiment described herein, but rather, it should be understood that the present invention has wide applicability with respect to multi-user applications generally. All modifications, variations, or equivalent arrangements and implementations that are within the scope of the attached claims should therefore be considered within the scope of the invention.

The invention claimed is:

1. A method for controlling scanning synchronization error in a projection imaging system, the method comprising:
    obtaining one or more scanning synchronization error maps comprising a plurality of error components;
    obtaining one or more focal plane deviation (FPD) error maps comprising a plurality of error components;
    separating the one or more synchronization error maps and one or more FPD error maps error components into repeatable and non-repeatable parts;
    converting the repeatable parts into one or more mathematical models that express the repeatable parts in mode correctable and uncorrectable terms;
    inputting lens distortion map data, scanning synchronization error map data, FPD error map data, and the one or more mathematical models into a database linked to a process controller that executes process control algorithms; and
    correcting scanner motion of the projection imaging system based on output from the process controller.

2. The method of claim 1, wherein correcting scanner motion is performed by a wafer stage controller based on the output received from the process controller.

3. The method of claim 1, wherein correcting scanner motion is performed by a reticle stage controller based on the output received from the process controller.

4. The method of claim 1, wherein the projection imaging system comprises a photolithographic step and scan machine.

5. The method of claim 1, wherein the projection imaging system comprises a scanning electron beam imaging system, scanning direct write tool, or scalpel tool.

6. The method of claim 1, wherein the projection imaging system comprises a scanning extreme ultra-violet photolithographic tool.

7. The method of claim 1, wherein the projection imaging system comprises a scanning x-ray imaging system.

8. The method of claim 1, wherein obtaining one or more scanning synchronization error maps comprises recording one or more interferometer transverse error signals Xsl(ys), Ysl(ys), and YAW(ys) that represent synchronization error between wafer and reticle stage of the projection imaging system.

9. The method of claim 1, wherein obtaining one or more FPD error maps comprises recording dynamic scan focal plane deviation $\Delta ZS(y)$, $\theta R(y)$ and scanner error in piston, roll, and pitch Zsl(ys), R(ys), and P(ys).

10. The method of claim 1, wherein the one or more scanning synchronization error maps comprise an equivalent instantaneous error map based on observed scan results and interferometer generated error maps.

11. A method of scanning control in a photolithography projection imaging system, the method comprising:

determining one or more scanning synchronization error maps of the projection imaging system;

determining one or more focal plane deviation (FPD) error maps of the projection imaging system; and controlling the projection imaging system scanning in response to data comprising lens distortion map data of the projection imaging system and the scanning synchronization error map data and the FPD error map data.

12. The method of claim 11, wherein determining one or more scanning synchronization error maps comprises recording one or more interferometer transverse error signals Xsl(ys), Ysl(ys), and YAW(ys) that represent synchronization error between wafer and reticle stage of the projection imaging system.

13. The method of claim 11, wherein determining one or more FPD error maps comprises recording dynamic scan focal plane deviation ΔZS(y), θR(y) and scanner error in piston, roll, and pitch Zsl(ys), R(ys), and P(ys).

14. The method of claim 11, wherein the determined one or more scanning synchronization and FPD error maps comprise an equivalent instantaneous error map based on observed scan results and interferometer generated error maps.

15. A method of producing a photolithographic chip mask work from a photolithography projection imaging system, the method comprising:

projecting a desired mask work reticle in the projection imaging system;

controlling scanning in the photolithography projection imaging system by performing operations comprising;

determining one or more scanning synchronization error maps of the projection imaging system;

determining one or more focal plane deviation (FPD) error maps of the projection imaging system; and controlling the projection imaging system scanning in response to data comprising lens distortion map data of the projection imaging system and the scanning synchronization error map data and the FPD error map data.

16. The method of claim 15, wherein determining one or more scanning synchronization error maps comprises recording one or more interferometer transverse error signals Xsl(ys), Ysl(ys), and YAW(ys) that represent synchronization error between wafer and reticle stage of the projection imaging system.

17. The method of claim 15, wherein determining one or more FPD error maps comprises recording dynamic scan focal plane deviation ΔZS(y), θR(y) and scanner error in piston, roll, and pitch Zsl(ys), R(ys), and P(ys).

18. The method of claim 15, wherein the determined one or more scanning synchronization and FPD error maps comprise an equivalent instantaneous error map based on observed scan results and interferometer generated error maps.

19. A photolithographic projection imaging system comprising:

a scanning controller that controls a scanner of the projection imaging system;

a process controller that processes operational data of the projection imaging system and determines one or more scanning synchronization error maps of the projection imaging system, determines one or more focal plane deviation (FPD) error maps of the projection imaging system, and provides control signals to the scanning controller in response to processing data comprising lens distortion map data of the projection imaging system and the scanning synchronization error map data and the FPD error map data.

20. The projection imaging system of claim 19, wherein the process controller determines the one or more scanning synchronization error maps by recording one or more interferometer transverse error signals Xsl(ys), Ysl(ys), and YAW(ys) that represent synchronization error between wafer and reticle stage of the projection imaging system.

21. The projection imaging system of claim 19, wherein the process controller determines the one or more FPD error maps by recording dynamic scan focal plane deviation ΔZS(y), θR(y) and scanner error in piston, roll, and pitch Zsl(ys), R(ys), and P(ys).

22. The projection imaging system of claim 19, wherein the one or more scanning synchronization and FPD error maps determined by the process controller comprise at least one scanning synchronization error map based on an equivalent instantaneous error map and an interferometer generated error map.

23. A microelectronic chip production system comprising:

a production system controller that operates the system so as to produce microelectronic chips; and a photolithographic projection imaging system comprising:

a scanning controller that controls a scanner of the projection imaging system;

a process controller that processes operational data of the projection imaging system and determines one or more scanning synchronization error maps of the projection imaging system, determines one or more focal plane deviation (FPD) error maps of the projection imaging system, and provides control signals to the scanning controller in response to processing data comprising lens distortion map data of the projection imaging system and the scanning synchronization error map data and the FPD error map data.

24. The microelectronic chip production system of claim 23, wherein the process controller determines the one or more scanning synchronization error maps by recording one or more interferometer transverse error signals Xsl(ys), Ysl(ys), and YAW(ys) that represent synchronization error between wafer and reticle stage of the projection imaging system.

25. The microelectronic chip production system of claim 23, wherein the process controller determines the one or more FPD error maps by recording dynamic scan focal plane deviation ΔZS(y), θR(y) and scanner error in piston, roll, and pitch Zsl(ys), R(ys), and P(ys).

26. The microelectronic chip production system of claim 23, wherein the one or more scanning synchronization and FPD error maps determined by the process controller comprise at least one scanning synchronization error map based on an equivalent instantaneous error map and an interferometer generated error map.

27. A method of controlling a scanner projection imaging system comprising:

obtaining a scanning synchronization error map;

obtaining a focal plane deviation error map;

determining scanner error maps; and determining control models based on the scanner error map.

28. A method as defined in claim 27, wherein the scanning synchronization error map is based on transverse scanning synchronization error and corresponding interferometer transverse errors.

29. A method as defined in claim 27, wherein the focal plane deviation error map is based on Z-scanning synchronization errors and corresponding interferometer Z-errors.

30. A method as defined in claim 27, wherein the control models are used to control a wafer stage.

31. A method as defined in claim 27, wherein the control models are used to control a reticle stage.

32. A method of manufacturing a semiconductor, the method comprising:
   obtaining a scanning synchronization error map of a projection imaging system;
   obtaining a focal plane deviation error map of the projection imaging system;
   determining scanner error maps for the projection imaging system; and
   determining control models of the projection imaging system based on the scanner error map.

33. A method as defined in claim 32, wherein the control models are used to control a wafer stage.

34. A method as defined in claim 32, wherein the control models are used to control a reticle stage.

35. An apparatus for determining scanning synchronization control models, the apparatus comprising:
   a data interface that receives scanning synchronization error data, focal plane deviation data of a scanning projection imaging system; and
   a processor configured to accept the scanning synchronization error data and focal plane deviation data from the data interface wherein the processor determines scanner error maps for the projection imaging system and outputs control models of the scanning projection imaging system based on the scanning synchronization error data and focal plane deviation data.

36. An apparatus as defined in claim 35, wherein the scanning synchronization error map is based on transverse scanning synchronization error and corresponding interferometer transverse errors.

37. An apparatus as defined in claim 35, wherein the focal plane deviation error map is based on Z-scanning synchronization errors and corresponding interferometer Z-errors.

38. An apparatus as defined in claim 35, wherein the control models are used to control a wafer stage.

39. An apparatus as defined in claim 35, wherein the control models are used to control a reticle stage.

* * * * *